United States Patent [19]

Schmitt et al.

[11] Patent Number: 5,693,238
[45] Date of Patent: Dec. 2, 1997

[54] METHOD FOR IMPROVING THE RATE OF A PLASMA ENHANCED VACUUM TREATMENT

[75] Inventors: Jacques Schmitt, La Ville du Bois, France; Paul-René Muralt, Sarraz, Switzerland

[73] Assignee: Balzers Aktiengesellschaft, Liechtenstein

[21] Appl. No.: 237,432

[22] Filed: May 3, 1994

[30] Foreign Application Priority Data

May 3, 1993 [CH] Switzerland .................. 1344/93

[51] Int. Cl.$^6$ .................................................. C23C 16/50
[52] U.S. Cl. .................. 216/67; 156/345; 156/643.1; 216/61; 118/723 MW
[58] Field of Search .................. 156/345, 643.1; 216/67, 23, 25, 61; 118/723 R, 723 MW, 723 E

[56] References Cited

U.S. PATENT DOCUMENTS

| | | | |
|---|---|---|---|
| 4,512,283 | 4/1985 | Bonifield | 156/345 |
| 4,579,618 | 4/1986 | Celestino et al. | 156/345 |
| 4,614,639 | 9/1986 | Hegedus | 156/345 |
| 4,668,338 | 5/1987 | Maydan et al. | 156/345 |
| 4,668,365 | 5/1987 | Foster | 156/345 |
| 4,981,722 | 1/1991 | Möller | 156/643.1 |
| 5,000,113 | 3/1991 | Wang et al. | 118/723 |
| 5,102,496 | 4/1992 | Saras | 156/345 |
| 5,269,847 | 12/1993 | Anderson et al. | 156/345 |
| 5,286,337 | 2/1994 | Tsou | 156/643 |
| 5,298,720 | 3/1994 | Cuomo et al. | 156/345 |
| 5,302,237 | 4/1994 | Larson | 156/345 |
| 5,328,555 | 7/1994 | Gupta | 156/345 |
| 5,350,454 | 9/1994 | Ohkawa | 118/723 R |
| 5,367,139 | 11/1994 | Bennett et al. | 156/345 |
| 5,456,796 | 10/1995 | Gupta et al. | 156/643.1 |

FOREIGN PATENT DOCUMENTS

| | | |
|---|---|---|
| 0 272 140 A2 | 6/1988 | European Pat. Off. |
| 0 419 930 A3 | 4/1991 | European Pat. Off. |
| 0 425 419 A3 | 5/1991 | European Pat. Off. |
| 0 453 780 A2 | 10/1991 | European Pat. Off. |
| 4031770 | 4/1992 | Germany . |
| 58-089944 | 5/1983 | Japan . |
| 59-168641 | 9/1984 | Japan . |
| 59-181619 | 10/1984 | Japan . |
| 63-004064 | 1/1988 | Japan . |
| 63-032849 | 2/1988 | Japan . |
| 05051753 | 3/1993 | Japan . |
| WO8809268 | 12/1988 | WIPO . |

OTHER PUBLICATIONS

"Reducing Dust–Induced Pinholes In Sputter Films"; E. Stern; IBM Tech. Disclosure; vol. 12, No. 1, Jun. 1969*, p. 149.

Primary Examiner—R. Bruce Breneman
Assistant Examiner—George Goudreau
Attorney, Agent, or Firm—Evenson, McKeown, Edwards & Lenahan, P.L.L.C.

[57] ABSTRACT

For increasing the rate with which a workpiece is treated in a plasma enhanced chemical vapor deposition method and thereby lowering for coating treatment exposure of the coating to ion impact, there is maintained a non-vanishing dust particle density along the surface to be treated with a predetermined density distribution along this surface. The density distribution may be controlled by appropriately applying a field of force substantially in parallelism to the surface to be treated and acting on the dust particles entrapped in the plasma discharge.

31 Claims, 9 Drawing Sheets

METHOD FOR IMPROVING THE RATE OF A PLASMA ENHANCED VACUUM TREATMENT

BACKGROUND AND SUMMARY OF THE INVENTION

1. Field of the invention

The present invention is directed to a method and vacuum plasma chamber for improving the treatment rate of a plasma enhanced vacuum treatment of a surface of workpiece.

We thereby define the treatment rate of such vacuum treatment of a surface as the amount of material per time unit which is removed or which is deposited from or on that surface respectively.

Thereby the present invention is especially directed to such an improvement for reactive plasma etching, reactive plasma sputter coating, reactive ion plating or and especially for plasma enhanced chemical vapor deposition coating known as PECVD.

Especially for semi-conductor production where plasma enhanced treating processes are used, thereby especially plasma enhanced coating processes, it is of tremendous importance to prevent the workpiece surface being treated from being contaminated by contamination particles, especially by dust or powder particles. Under plasma enhanced coating treatments we especially understand plasma enhanced reactive coating treatments as e.g. plasma enhanced chemical vapor deposition known as PECVD treatments, and thereby especially enhanced by RF plasma at frequencies from 1 to 100 MHz.

Preventing such contamination is a most serious problem to be resolved for such manufacturing processes.

The attempts to resolve this problem up to now were directed on trying to minimize the generation of dust or powder during such treatment processes. Nevertheless, such dust or powder generation may not completely be prevented. Therefore, the attempts were additionally directed to removing the residually generated dust as efficiently as possible from that plasma discharge area which is significantly contributing to the treatment. This means that one tried to reach in the plasma discharge space there, where the plasma discharge is significantly contributing to the treatment, a dust- or powder-free state. Reference is made to the EP-A-425 419 and the EP-A-453 780. Attention is further drawn to the following prior art: EP-A-0 419 930 (corresponding to JP-A-3 153 885 and U.S. Pat. No. 5,102,496), EP-A-0 453 780 (corresponding to JP-A-5 074 737), EP-A-0 425 419 (corresponding to CA-A-2 024 637 and JP-A-3 147 317), EP-A-0 272 140 (corresponding to U.S. Pat. No. 5,000,113, JP-A-63 246 829, U.S. Pat. Nos. 4,872,947, 4,892,753, 4,960,488, 5,158,644).

It is an object of the present invention to improve the treatment rate and thereby especially, for a plasma enhanced coating deposition vacuum process, the coating rate without negatively affecting surface quality of the surface being treated, but thereby even improving its quality.

This object has been achieved by a method for improving the treatment rate of a plasma enhanced vacuum treatment of a surface of a workpiece which comprises the step of generating, substantially along the surface to be treated in the plasma, dust with a predetermined distribution of its density.

The basis of the present invention is the recognition made by the inventors that dust or powder particles in a plasma discharge significantly increase the coupling degree of electrical energy to the plasma. Due to this phenomenon the treatment rate and especially for a layer deposition treatment, the deposition rate is significantly increased. Additionally, such dust or powder particles in the plasma discharge lead to improved coating quality as e.g. to improved characteristics of the tensions within the deposited film or layer and of its fineness. This, nevertheless, is only true as long as it may be prevented that powder or dust particles accumulate on the surface being treated.

A typical vacuum range of operating pressure is between $10^{-2}$ mbar and 10 mbar, thereby preferably between $10^{-1}$ mbar and 1 mbar.

Although the object to be fulfilled will also be achieved e.g. for reactive sputter etching treatments, it shall especially be achieved for coating processes, thereby especially for reactive plasma enhanced processes and especially RF plasma enhanced reactive coating processes, so-called RF-PECVD processes.

Although especially directed to the RF-PECVD treatments, the inventive method may principally also be used for DC or AC plasma treatment or for hybrid forms with AC+DC plasma.

In contrast to the customary approaches, namely to remove powder or dust as completely as possible from the plasma discharge area which is affecting the surface treatment, the present invention maintains in a well controlled manner the powder trapped in the plasma discharge so as to reach the advantages with respect to treatment rate and treatment quality mentioned above. Additionally, the density of the dust or powder entrapped in the plasma discharge is maintained below a predetermined value at which value powder or dust deposition on the surface being treated would start.

Thus, inventively, the number of dust particles per volume unit and/or the largeness of dust particles and thus generally the dust density and its distribution is controlled especially not to vanish. By such control, predetermined density and density distribution are achieved which have been found as optimal for a specific treatment process considered during pre-experiments. Thus, prevailing dust is utilized and not just removed as completely as possible.

It is a second object of the present invention to control dust density in a plasma discharge. This is achieved by a method for reducing dust density in a plasma discharge space with a plasma to which a workpiece surface to be treated is substantially uniformly exposed, which comprises the step of applying substantially parallel to the surface to be treated and across said surface in said plasma a field of force acting on dust particles being trapped in said plasma.

By generating such a field of forces and by adjusting such field as concerns its local extent, its distribution and strength, a desired amount of powder or dust is removed from that plasma discharge space which is significantly contributing to the surface treatment. The removed powder or dust is primarily conveyed into a space which less significantly affects the treatment, and from that space the dust or powder may further be removed whenever necessary.

As a preferred embodiment, there is thus proposed a method for improving the treatment rate of a plasma enhanced vacuum treatment of a surface of a workpiece, which comprises the steps of generating substantially along the surface to be treated, in the plasma, dust with a predetermined distribution of its density and generating said predetermined density by applying substantially parallel to the surface and transversally therealong within the plasma a field of force acting on the particles of the dust, predominant parts thereof being trapped in the plasma.

It is a further object of the invention to control dust density as simply as possible.

This is realized by generating the field of force, at least in parts, in a preferred mode predominantly by generating a gradient of pressure. Thereby, such field of force may also, additionally to the gradient of pressure or exclusively, be generated by an electrostatic and/or by a thermal gradient, the latter in the sense of exploiting thermophoresis.

Further, the primary object mentioned above is resolved by a vacuum plasma chamber with generating apparatus for a three-dimensionally distributed plasma discharge in a discharge space, with a workpiece support defining a support area for at least one workpiece to be treated and for exposing at least one workpiece surface area to said plasma discharge in said space which comprises a force generator for generating a field of force substantially parallel to and along said support area and within said plasma discharge, and controlling the density of dust in said plasma discharge.

The primary object is resolved primarily for treatment of substantially flat large area workpieces, as especially for flat active panel displays, which is achieved by the inventive method and plasma chamber being applied and construed respectively to and for such workpieces respectively.

BRIEF DESCRIPTION OF THE DRAWINGS

The present invention will be better understood and objects other than those set forth above will become apparent when consideration is given to the following detailed description thereof.

Such description makes reference to the annexed drawings, wherein:

FIG. 6 shows schematically and in cross-section a preferred embodiment of a load-lock chamber magazine arrangement at the arrangement according to FIG. 2a;

DESCRIPTION OF THE PREFERRED EMBODIMENTS

In the present description, by the expression "plasma chamber", there is understood an evacuatable space area wherein an independent plasma discharge may be sustained continuously or at least sometimes pulsed, be it a DC, an AC or, mixed, an AC+DC plasma discharge, thereby especially an RF plasma discharge. With respect to such chambers attention is directed to the EP-A-0 221 812 and the EP-A-0 312 447 which are both integrated by reference to the present description. Such a plasma chamber is in a preferred manner at least in part limited by walls. Typically in such a plasma chamber a pressure of $10^{-2}$ mbar to 10 mbar is sustained, preferably of $10^{-1}$ mbar to 1 mbar.

Figure 1:
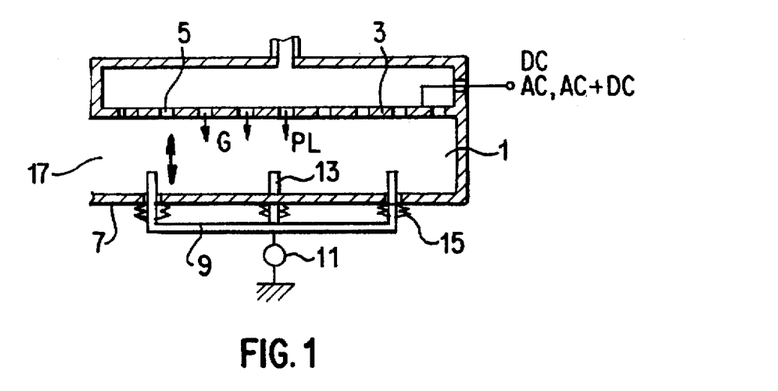
FIG. 1 shows schematically in a cross-section a plasma chamber at which, for example, the inventive method is applied.

In FIG. 1, as an example and as a preferred variant, there is schematically shown a plasma chamber 1. It comprises on its upper side an areally extended electrode 3 which is fed by DC, AC or AC+DC electric energy, whereby the general expression AC shall, as was mentioned, especially enclose RF signals. Under the general term AC+DC mixed feed pulsed DC and/or pulsed RF signals are also understood. Under RF a frequency band between 1 and 100 MHz shall be understood.

At the embodiment shown in FIG. 1, the areally flat electrode 3 comprises areally distributed outlet openings 5, by which a gas, which at least comprises a reactive gas part, is fed to the plasma discharge space PL. At the bottom 7 of the plasma chamber 1 there is provided, in this preferred embodiment, a lifting mechanism 9 with a drive arrangement 11 for rising workpiece substrates. The lifting mechanism comprises e.g. three or four lifting rods 13 which are simultaneously moved by the drive 11 and which are e.g. sealed towards ambient of the plasma chamber 1 by means of bellows 15. It is also possible to construe the rods 13 so that they seal themselves the respective openings at the bottom 7 when they are lowered.

Such a plasma chamber forms the basic device for the inventive apparatus which will subsequently be described, which apparatus is in a clearly preferred manner an apparatus for performing PECVD coating of workpieces, but which could be also an apparatus for other vacuum treatment processes. Thereby, the inventive apparatus is preferably an RFPECVD layer deposition apparatus.

In FIG. 2 there is schematically shown a nearly minimal configuration of an inventive apparatus. Such apparatus comprises, as was said in its nearly minimal configuration, a stack 20 of e.g. twenty plasma chambers 1 which are stacked one above the other. The plasma chambers 1 are merely shown in the FIGS. 2a to 2d schematically, but are, in a preferred manner, construed from chambers, one of which was shown and explained with the help of FIG. 1.

The plasma chambers 1 comprise each a lateral handling opening 17, which openings thus form together a handling opening staple. All handling openings communicate into a common vacuum space 23. This vacuum space 23 into which the said handling openings abut from the interior of the plasma chambers forms a transport chamber $23_T$. In this transport chamber $23_T$ there is provided a transport arrangement 25 which comprises a number of horizontal supports 27 which are, in a preferred construction, formed as support forks. The number of horizontal supports 27 foreseen is equal to the number of plasma chambers 1 which define the stack 20. The supports 27 are, as schematically shown by the arrow H, preferably synchronously, movable in horizontal direction, e.g., and as shown, in that they all are mounted to a carrier beam 29 which is drivingly moved forth and back. By this horizontal movement workpieces, namely in a preferred mode flat a real workpieces 31, are fed through the handling openings 17 to the plasma chambers 1 or are recovered from said plasma chambers 1 to the transport chamber $23_T$ as is shown from FIGS. 2b to 2d.

Figure 2A:
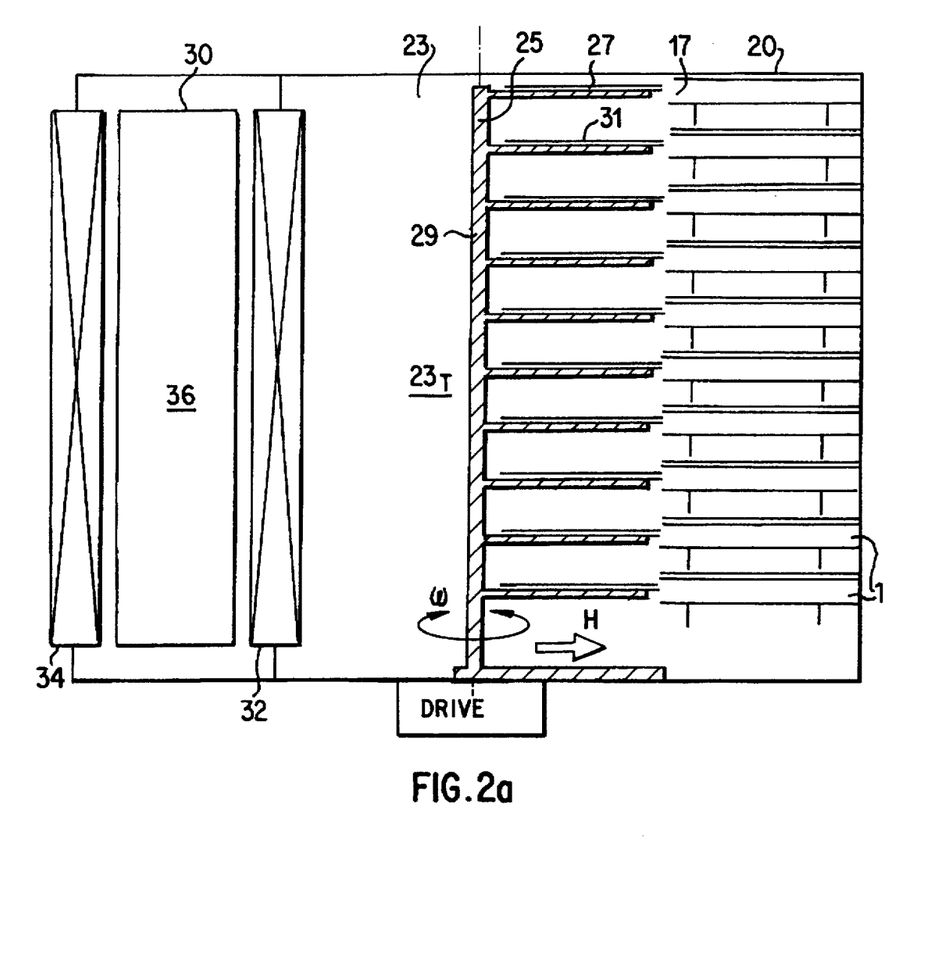
FIG. 2a schematically shows a preferred small configuration of a vacuum treatment arrangement, wherein preferably the inventive method is operated.
Figure 2B:
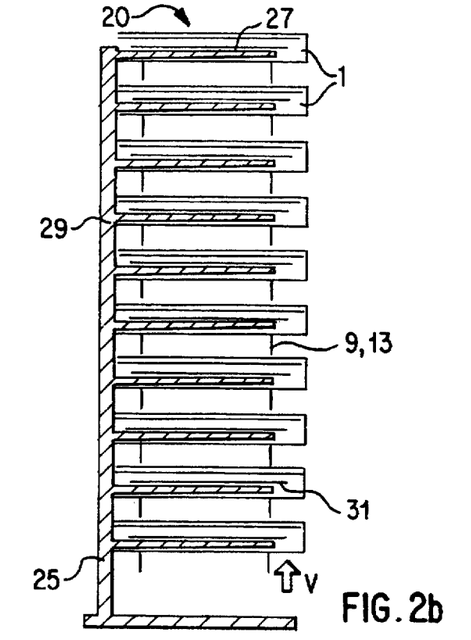
FIGS. 2b to 2d show departing from the arrangement according to FIG. 2a, charge and discharge cycles of plasma chambers of the arrangement, principally according to FIGS. 3a and 3b show schematically and at plasma chambers provided at the arrangement according to FIG. 2a, doors to at least controllably realize a pressure between the inside of the plasma chambers and a common chamber wherein lateral handling openings of the chambers abut or even reach vacuum seal.

For loading all the plasma chambers 1 of the staple 20, the transport arrangement 25, according to FIG. 2a, is moved to the right hand side up to reaching the position according to FIG. 2b. Then, the lifting mechanism 9, which was shown at the plasma chamber 1 of FIG. 1, with the rods 13, is lifted, so that in all plasma chambers 1 the workpieces 31 are simultaneously lifted from the supports 27. This is shown in FIG. 2b schematically by the arrow V.

Figure 2C:
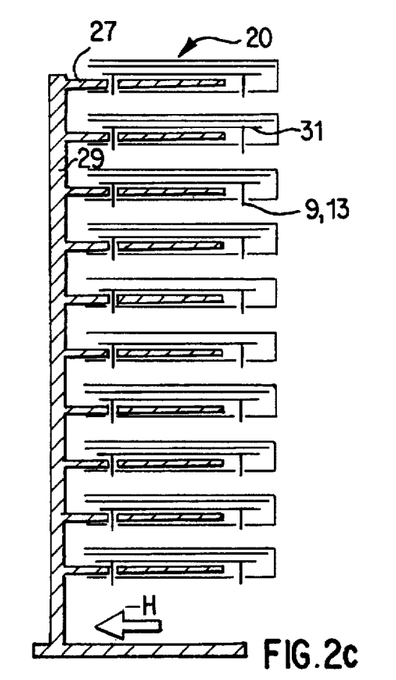
Figure 2D:
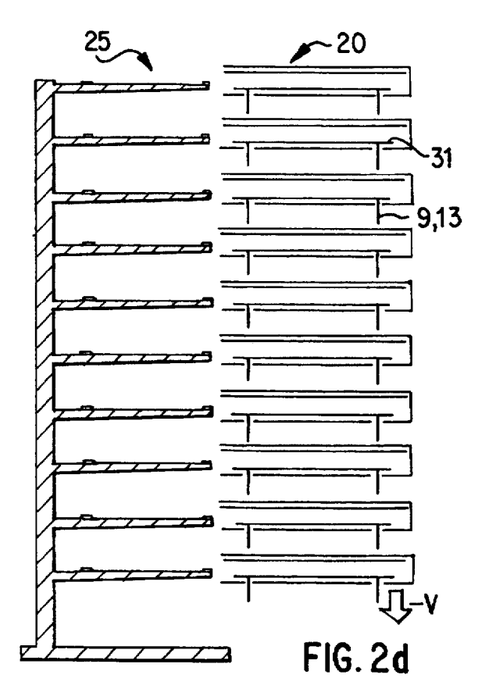

After lifting the workpieces 31 with the help of the lifting mechanism 9 with its lifting rods 13, according to FIG. 1, and reaching relative positioning according to FIG. 2c, the transport arrangement 25 with the supports 27 is horizontally moved back as shown in FIG. 2c by the arrow -H and the workpieces 31 are lowered into their treating position by lowering the lifting mechanism 9 according to FIG. 1.

It is evident that the described vertical relative movement of workpieces 31 with respect to the supports 27 could also be realized by synchronously lowering the supports 27 within the chambers 1 or, for recovering the workpieces, by synchronously lifting said supports 27, thereby depositing the workpieces in the chambers 1 for their treatment onto stationar supports.

In the nearly minimal configuration of the treatment apparatus which comprises, as was mentioned, a vacuum area with the plasma chamber staple 20 and further a transport area or space $23_T$, wherein the transport arrangement 25 is arranged and moved, further comprises, according to FIG. 2a, a load-lock chamber 30. As schematically shown, the load-lock chamber 30 is locked towards the transport area $23_T$ by a first load-lock gate 32 and towards ambient by a further load-lock gate 34. Within the load-lock chamber there is provided a magazine arrangement 36 for buffering workpieces still to be treated and/or which have already been treated.

To be able not only to serve the staple 20 of plasma chambers 1, but also the magazine arrangement 36 within the load-lock chamber, the transport arrangement 25 is not only shiftable in the horizontal direction H or -H, but is additionally drivingly rotatable around a vertical axis as shown at ω. Thereby, the supports 27 are rotated into serving positions for the load-lock chamber 30 and the magazine arrangement therein and into serving position for the handling openings of the plasma chambers 1.

As was mentioned above, the plasma chambers 1 of the staple 20 are preferably construed so as to perform PECVD treatments. Depending on the treatment process to be performed therein, the handling openings 17 of the plasma chambers 1 remain open towards the transport area $23_T$ during workpiece processing within the chambers 1, or there is just installed a pressure stage between the inside of the plasma chambers 1 and the transport area $23_T$, across which a pressure difference between inside of the plasma chambers and the transport area $23_T$ may be installed or the plasma chambers 1 are closed in a vacuum tight manner during the said workpiece treatment. If processing is PECVD, then the openings 17 are closed.

Figure 3A:
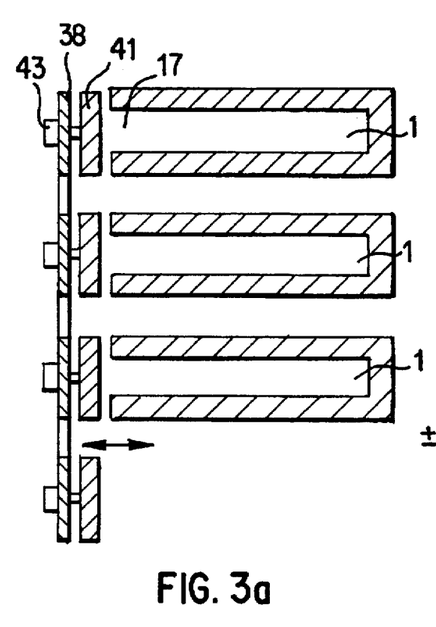
Figure 3B:
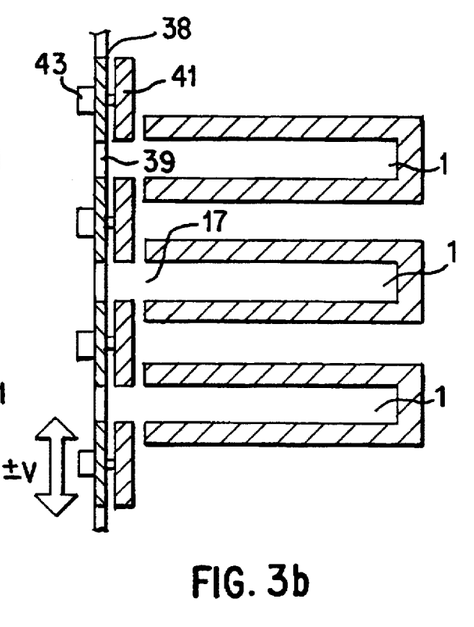

In FIG. 3 there are schematically shown two preferred modes of realization for shutting the handling openings 17 during workpiece treatment in a vacuum tight manner or just for installing a pressure stage with respect to said transport area $23_T$. A movable slide 38, movable in vertical direction as shown by the double arrow ±V, is provided which, rastered, according to the handling openings 17 along the staple 20, is provided with handling feed-through openings 39. The handling feed-through openings 39 are positioned by respective moving of the slide 38, according to FIG. 3b, to be aligned with the handling openings 17 of the plasma chambers 1, when handling of workpieces through the handling openings 17 is to be performed. In this position, the supports 27 may serve the plasma chambers through the feed-through handling openings 39.

The slide 38 further comprises horizontally driven, movable shut-off plates 41 which are e.g. driven by capsulated driving rods and drives 43.

For shutting-off the treating areas within the chambers 1, the slide 38 is vertically moved into the position as shown in FIG. 3a. Then, the shut-off plates 41 are driven, according to that figure, to the right hand side, so as to shut off the handling openings 17 of the plasma chambers 1 in a vacuum tight manner or so as to just install between the transport area $23_T$ and the said treatment areas within said chambers 1 a pressure stage, whereacross pressure difference may be installed.

Departing from the nearly minimal configuration of the inventive apparatus according to FIG. 2, FIG. 4 schematically shows in top view an enlarged apparatus which now comprises two plasma chamber staples 20a and 20b as well as a transport area $23_T$ and a load-lock chamber 30. With the help of the sequence of figures from 4a to 4e, a preferred operation of such an inventive apparatus, especially for a PECVD treatment process, shall be described.

Figure 4A:
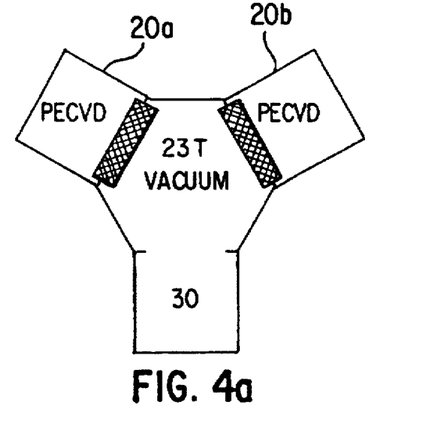
FIGS. 4a to 4e show schematically in top view a further arrangement with two plasma chamber staples and one load-lock chamber and its preferred operating cycle, the invention being operated in such arrangement as one preferred mode.

In the operating phase, according to FIG. 4a, the workpieces are PECVD-treated in both the plasma chamber staples 20a and 20b. To do this, there is at least installed a pressure difference across a pressure stage after shut-off of the handling openings 17 of the plasma chambers 1. The load-lock gate 32, according to FIG. 2a, is opened, whereas the load-lock gate 34 towards ambient is closed.

Figure 4B:
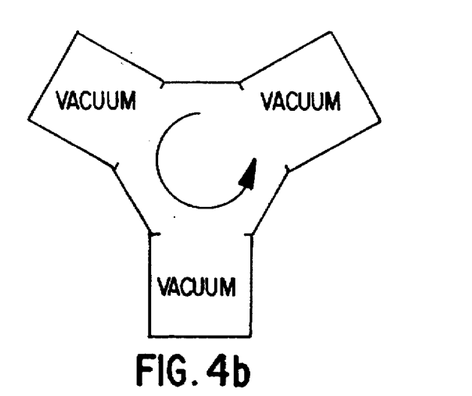

After termination of the treatment process, and as shown in FIG. 4b, the staples 20a and 20b are unloaded by means of the transport arrangement 25, according to FIG. 2a. Thereby, in a preferred mode, the two staples 20a and 20b are unloaded sequentially and the treated workpieces are deposited within the magazine arrangement 36 in the load-lock chamber 30. As will be described later, the magazine arrangement 36 comprises magazine slots, the number of which preferably according with at least the number of workpieces which may be simultaneously treated in the overall apparatus. In other words, with two plasma chamber staples, according to FIG. 4, there are preferably provided at least as many magazine slots as plasma chambers at the two staples.

Figure 4C:
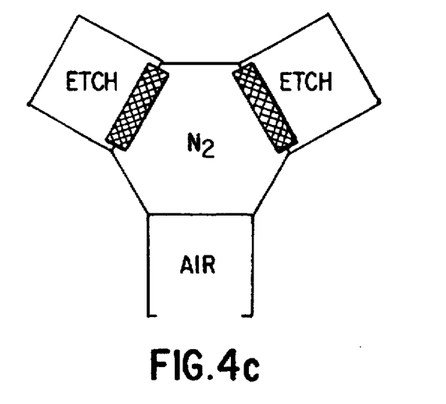

According to FIG. 4c, the load-lock gate towards the transport area $23_T$ is then shut and the load-lock gate 34 opened. The treated workpieces deposited within the magazine arrangement 36 are now replaced by workpieces still to be treated. During this unloading cycle of the magazine arrangement 36, the plasma chambers 1 of the staples are etched-cleaned, preferably by means of an RF plasma. To thereby prevent that cleaning gas and reaction products consisting of cleaning gas and etched-off material, etched-off from the plasma chambers being etched-cleaned, penetrate into the transport area $23_T$, in a preferred arrangement, as was described with the help of FIG. 3, there is installed a pressure difference between plasma chambers 1 and the transport area $23_T$, pointing towards the inside of the plasma chambers 1.

To do this, there is introduced a neutral gas into the transport area $23_T$, as e.g. nitrogen, in such a manner that there results a pressure gradient dropping from the transport area $23_T$ towards and into the plasma chambers 1. There is thereby prevented that cleaning dust penetrates into the transport area $23_T$. The chambers 1 themselves are pumped during cleaning etching.

During this time-span, the magazine arrangement 36 has been loaded with workpieces to be treated. These are then, in the next following step according to FIG. 4d, distributed to the now cleaned plasma chambers of the staples.

Due to the cleaning etching step, the walls and the electrode surfaces of the plasma chambers 1 have been heated.

Figure 4D:
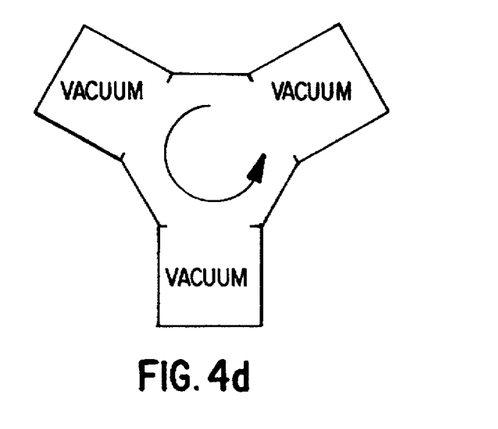
Figure 4E:
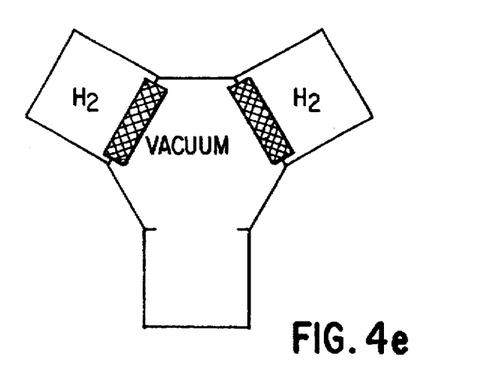

This heat is now, in a preferred mode according to step 4e, used for preheating the workpieces which are now loaded into the plasma chambers 1. Because distribution of the workpieces, in cycle according to FIG. 4d, is performed in vacuum, the heat conduction from the said parts, which have been heated by cleaning etching, is relatively low. Thus, after the workpieces to be treated have been loaded in the plasma chambers 1 and the latter are separated according to the description of FIG. 3 at least by a pressure stage from the transport area $23_T$, there is introduced a heat conducting gas, as e.g. hydrogen or helium, into the plasma chambers 1 with such a pressure that a significant heat conductance is initiated between the said heated parts of the plasma chambers 1 and the workpieces residing within the said cheers 1.

By means of such preheating of the workpieces, the workpieces, which were before stocked in normal atmosphere, are de-gased. After this preheating they are now, according to FIG. 4a, treated in the plasma chambers 1, so, in a preferred mode, PECVD coated.

In the apparatus as shown, all the plasma chambers 1 are separately pumped in a preferred embodiment. This especially during cleaning etching and during heating de-gasing of the workpieces.

Figure 5A:
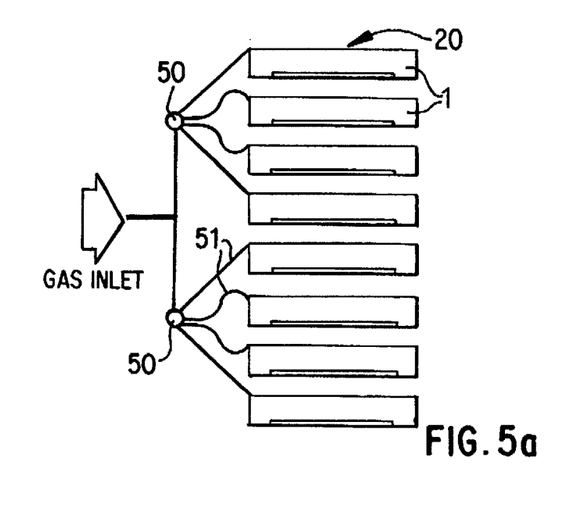
FIGS. 5a to 5d show schematically with respect to a plasma chamber staple as provided in the arrangement according to FIG. 2a, respectively, its centralized feeding with gas, its centralized pumping, its centralized feeding with electrical energy as well as a centralized handling of measuring and/or adjusting signals shown by the example of centrally monitoring the plasma processes in the different plasma chambers by way of a central plasma emission monitor.

As schematically shown in FIG. 5, for reactive treatment processes to be performed, and especially for the preferred PECVD processes, according to FIG. 5a, all the plasma chambers 1 of at least one staple are fed from a central reactive gas feed. Thereby, it is ensured that all the chambers 1 are equally loaded with reactive gas. This is realized e.g. by feeding the gas departing from a buffer chamber 50 of relatively large volume to the chambers 1 via equal gas flow ducts 51, i.e. providing for equal flow resistances.

Figure 5B:
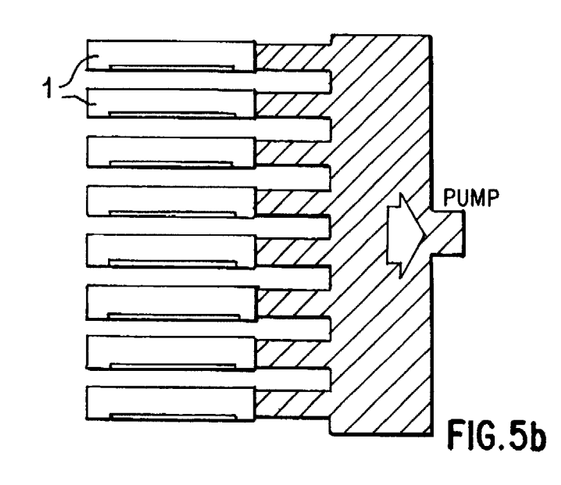

According to FIG. 5b, the chambers 1 are further, in a preferred mode, pumped from a central pump arrangement as all the chambers 1 of at least one staple should be synchronously pumped.

Figure 5C:
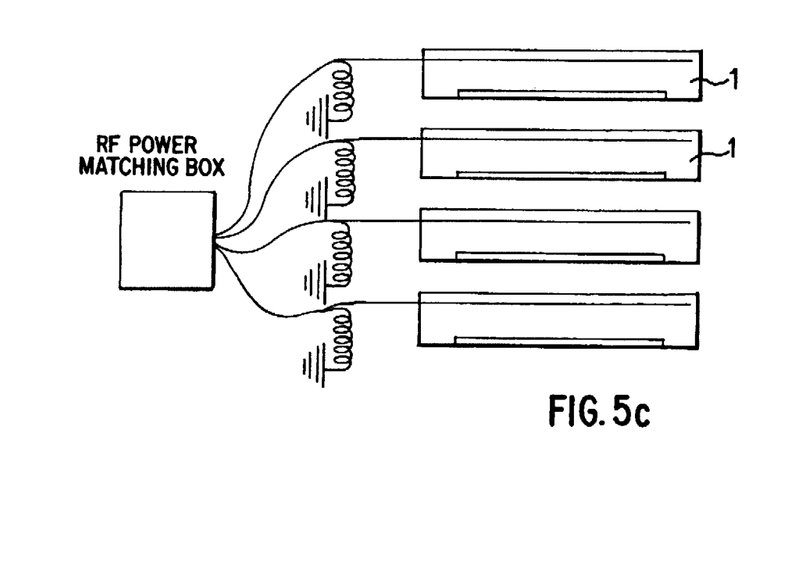

The supply with electrical energy to the chambers 1 of at least one staple is preferably realized in a most economic way from a central generator unit. In the preferred case of treating the workpieces in an RF plasma, according to FIG. 5c, all the chambers 1 of at least one staple are fed from a central RF generator with a centralized matching network and, if necessary, with additional matching networks for chamber specific adjustment. This is shown in FIG. 5c by the respective inductions assigned to the respective chambers, wherewith different RF power conditions may be adjusted for every chamber 1.

If the processes performed within the plasma chambers 1 shall be monitored, open-loop controlled or negative feedback controlled, this, too, is preferably performed via a central unit. This central unit is linked to the different chambers 1, according to the occurring need, be it in the sense of multiplexing with a predetermined sequence of connection to the chambers, be it with a varying sequence, controlled by the need at the different chambers 1.

Figure 5D:
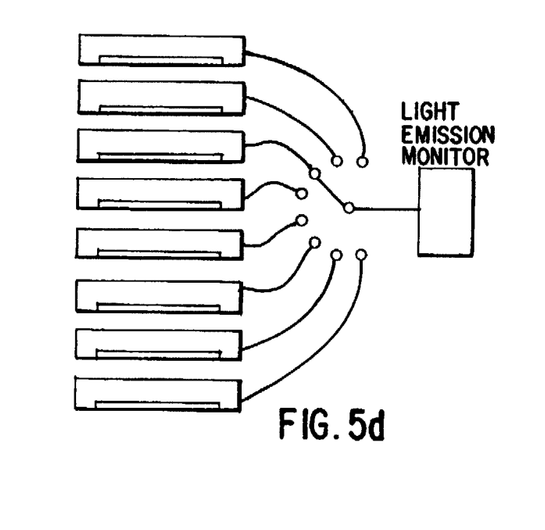

This is schematically shown in FIG. 5d by means of an example, which shows monitoring the processes in the chambers 1 by means of a central plasma emission monitor which is sequentially connected to the different chambers.

Figure 6:
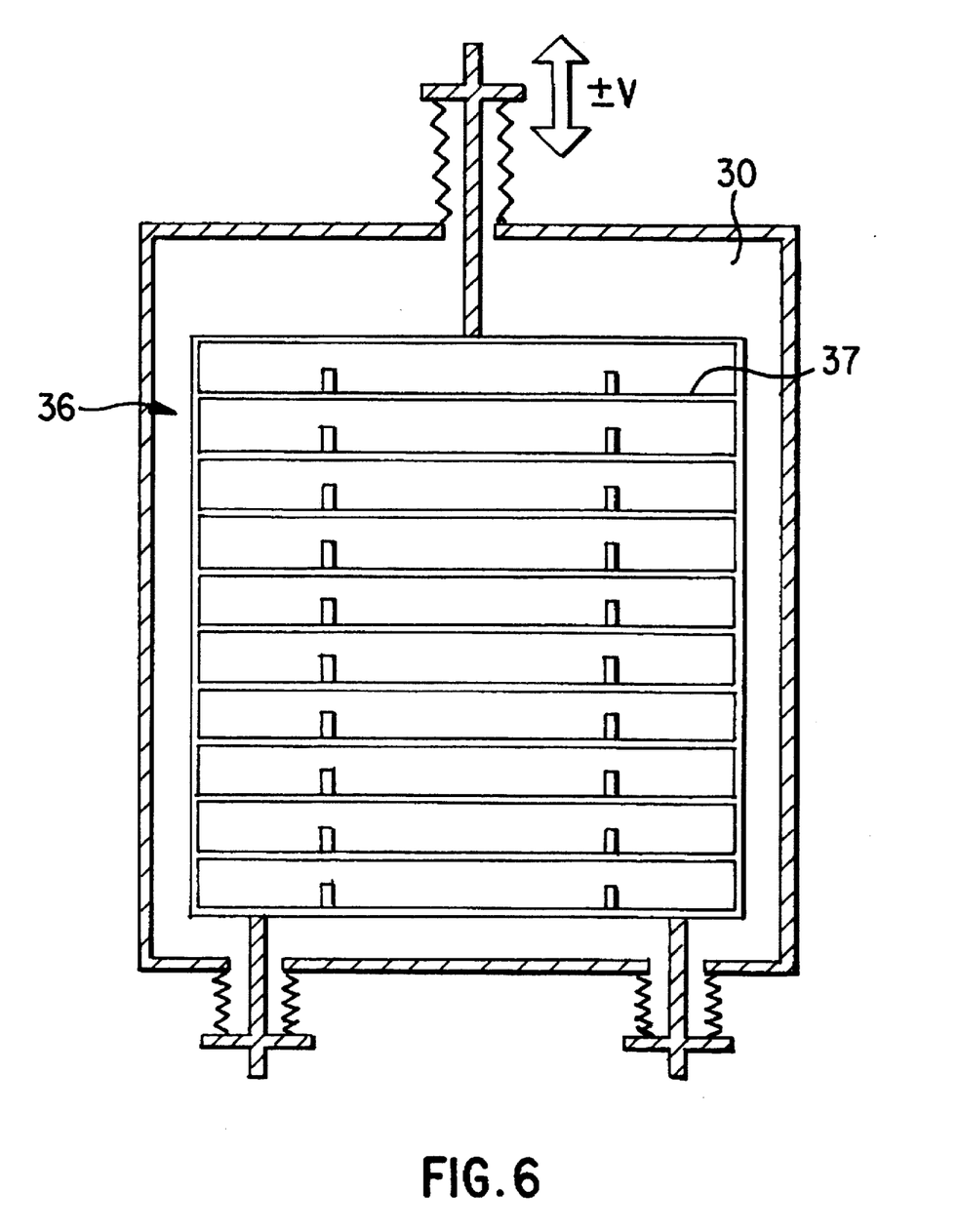

In FIG. 6 there is schematically shown a preferred construction of a magazine arrangement 36 in a magazine or load-lock chamber 30 according to FIG. 2a. The magazine arrangement 36 comprises a number of magazine slots 37, the number of which being preferably at least equal to the number of workpieces which may synchronously be treated in the apparatus. The number of magazine slots is thereby preferably the double of the number of workpieces which may be synchronously treated, i.e. the number of plasma chambers at the inventive apparatus. Thereby, feed-through of workpieces through the load-lock chamber is significantly simplified. In the case where, according to FIG. 2a, there is installed a relative vertical movement between resting surfaces for the workpieces in the chambers 1 and the supports 27 by lifting mechanism 9 in the plasma chambers 1, as explained with the help of FIG. 1, and thus the supports 27 do not perform vertical loading and unloading movements, then, and according to FIG. 6, the magazine arrangement 36 is preferably vertically movable as shown with the double arrow ±V. Thereby, the workpieces may be lifted off or deposited from or on the supports 27.

Up to this point, there was described a novel apparatus concept as well as its preferred operation, especially for RF-PECVD coating processes.

In the following, there will be described a novel method which also and especially may be realized at the said described inventive apparatus. This method and accordingly apparative features to perform it results in a significant improvement of coating rate and coating quality at plasma coating processes. The method and the respective apparatus features to be described may be applied generally for plasma coating processes, be it DC, AC or AC+DC plasma processes, as they were defined before. The following description is nevertheless especially valid for reactive RF plasma enhanced coating processes as for RF-PECVD processes. They are, nevertheless, also valid e.g. for RF ion plating processes. Thereby, we understand, as was mentioned, under RF a frequency range between 1 and 100 MHz.

Nevertheless, when we refer in the following description to such RF plasma enhanced reactive processes, this shall not be understood as the described method restricted to such processes.

Figure 7A:
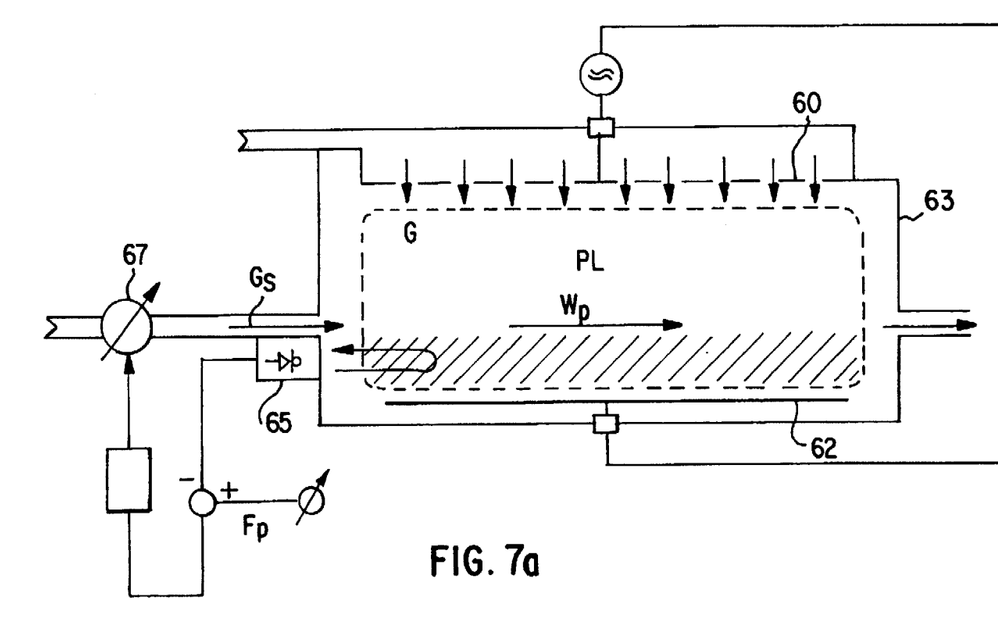
FIG. 7 shows schematically and in cross-section a plasma chamber as it is provided in a preferred embodiment within the plant according to FIG. 2a and which is operated and construed so as to realize the present invention.
Figure 7B:
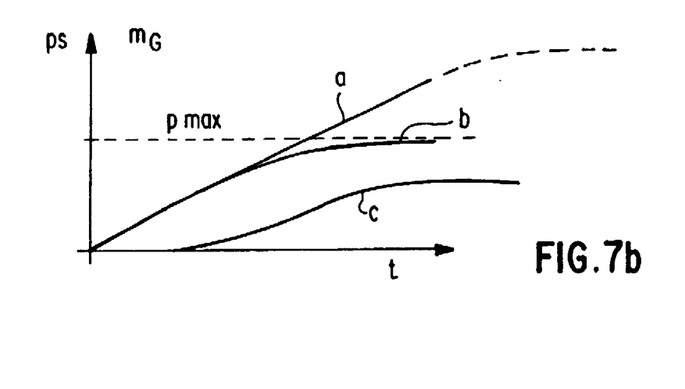

In FIG. 7 there is schematically shown a plasma chamber, e.g. of the kind as shown in the FIGS. 1 or 2. An areally extended RF electrode 60 forms also an areally distributed gas injection arrangement, at least for a reactive gas G, which gas is injected into the plasma discharge space PL. Opposite to the RF electrode 60 there is provided a workpiece carrier electrode 62, as known in this specific art.

With respect to electrical DC potential conditions, it is obvious to the man skilled in the art that the encapsulation walls 63 of the plasma chamber and/or the workpiece carrier electrode 62 may be deposited, as is common, on an electric reference potential, as e.g. on ground potential. Nevertheless, the man skilled in the art effectively knows all possibilities of biasing the different parts of the chamber to electric DC potentials.

At a reactive plasma coating of workpieces, e.g. deposited on the workpiece carrier electrode 62, there is formed dust within the plasma discharge space. The density of this dust is depicted by $\rho_r$. Dust in the plasma discharge may originate from a multitude of sources, mainly from the coating process itself, but also from mechanical friction during loading and unloading the chamber with workpieces. Principally, the dust density $\rho_r$ rises during a reactive coating process. This is shown at the bottom part of FIG. 7, purely qualitatively, by a steadily rising characteristic (a) of dust density over time.

Without any counter-measures, the dust will start to precipitate out of the plasma discharge and will deposit on the surfaces within the reactor chamber exposed to the plasma discharge. Thereby, the growing up layer on the workpiece is contaminated with dust particles, which leads to layer defects.

Additionally, the behaviour of the overall reactor is changed, which leads to drifting off of the process. Today's production plants which realize dusty processes, therefore, do not lead to coatings with the required low degree of defect nor do they reach the required low ratio between cleaning and production times, named equipment availability.

Up to now, the attempts to resolve these problems were to generate as few as possible dust. Because this may not completely be prevented, still generated dust was removed from the coating area as completely as possible. Thereby, one did not care about a resulting decrease of coating quality, as will be shown.

It was now recognized by the inventors of the present invention that dust present in a plasma discharge, and thereby especially in an RF plasma discharge, significantly increases the coupling degree of electrical energy, and thereby especially of RF energy, to the plasma and that principally the coating rate, and especially the coating rate of a reactive coating process, is significantly increased in a dusty plasma, especially in a dusty RF plasma.

Thus, up to now, preventing the formation of dust and removing dust from the plasma discharge led to nonexploitation of maximum possible coating rate and process efficiency. The considerations with respect to improving the efficiency and coating rate of a plasma coating process by dust are only valid so long as the dust density does not rise above a threshold value in the plasma discharge. If the dust density rises above such limit value, dust particles may start to agglomerate to form larger dust particles, which will aggregate on the coating just being about to be grown or having been deposited. Such aggregation must normally be prevented, especially in connection with semi-conductor production and the production of flat active display screens.

Thus, the novel recognition bases on the fact that dust in a plasma discharge area, especially in an RF plasma discharge area, as especially for a reactive plasma enhanced coating process, should not be removed, but the dust density should be maintained below or at the most on a predetermined value $\rho_{max}$. Thus, the number of dust particles per unit volume and/or the largeness of such particles and therewith again the dust density and the distribution thereof are inventively controllably adjusted. This adjustment is realized taking into consideration the results of pre-experiments, whereat, for a specific treatment process considered, concise optimal dust density values and distributions in the plasma discharge space have been found. As an example, there is shown in FIG. 7 with the curve (b) a possible time course of power density which is controllably aimed at.

This dust density control is generally realized, according to FIG. 7, by generating a dust particle transversal stream $W_p$ in a controlled manner by generating a transversal force field, so that excess dust particles are carried out of the active coating area of the plasma discharge and are finally removed as the need occurs from the chamber.

According to FIG. 7, a preferred realization form of such a transversal force field is to realize a transversal gas stream. This, again, is realized by installing a transversal pressure gradient. As schematically shown, to do this, gas is laterally fed to the reactor chamber and gas is removed from that chamber opposite to its inlet. Additionally, or instead of realizing a transversal pressure gradient, it is possible to realize transversal particle current by installing electrostatical gradients and/or thermical gradients, so as to disable dust density to rise in the coating effective area of the plasma discharge space above a predetermined value.

At the bottom of FIG. 7, the characteristic (c) qualitatively shows, as an example, the time course of controlled gas quantity $\dot{m}_G$ inlet.

In spite of the fact that it is absolutely possible to determine by pre-experiments when, during the coating process, a transversal force field should be installed and how large it should be, so as to control the dust density in the discharge space, it is, in a preferred mode of execution, absolutely possible to measure, e.g. by means of light reflection or absorption, as is schematically shown in FIG. 7 by the detector 65, the instantaneous dust density and possibly its distribution in the plasma. The instantaneous value is then compared with a rated value $F_p$ and the force field, which is, in FIG. 7, the pressure gradient, is then adjusted in a negative feedback controlled loop so that the dust density remains on a desired level. Because the plasma impedance is significantly influenced by the dust density, such a negative feedback control loop may also make use of a plasma impedance measurement to monitor the instantaneous dust density.

When a transversal gas stream is used to generate the described particle current, the adjustment of such transversal gas stream is preferably done by adjusting the amount of gas injected per time unit to the plasma discharge space, as is shown schematically in FIG. 7 by adjusting walls 67.

The force field which is used to remove excess dust particles from the coating area may also intermittently be applied. This would mean, in the case of FIG. 7, that a gas $G_r$, which will be generally named scavenger gas, which generates the transversal current W, is inlet in a timely pulsed manner.

As was already mentioned, this method has shown highly satisfying results, especially applied for reactive RF plasma coating processes. This, because such processes, and especially reactive processes, intrinsicly produce powder or dust in the plasma discharge.

If, according to FIG. 7, a scavenger gas $G_s$ is used to realize the transversal current W, preferably a neutral plasma working gas, as e.g. argon or helium, is used as scavenger gas or a gas which is not effective for the coating deposition, as e.g. hydrogen. Using a gas which significantly contributes to the coating formation as a scavenger gas, may influence coating deposition distribution in art undesired manner.

It is essential to recognize that dust or powder remains trapped within the plasma discharge as long as the plasma discharge is maintained. Thus, when a plasma treatment process or, more generally, the plasma discharge shall be interrupted and one wants to prevent that the dust trapped in the discharge settles in the treatment chamber, then one of the following procedures is proposed:

instead of reactive gas, a neutral gas is inlet, so that, when the coating formation shall be stopped at a predetermined time, a further coating deposition is stopped. By maintaining the now neutral plasma ignited, the dust remains trapped in the plasma discharge and is swept out. Thereby, additional formation of dust in the plasma, which is now a neutral plasma, is significantly reduced.

In the maintained reactive gas plasma discharge or in the just mentioned neutral discharge, the transversal force field is increased. In the preferred mode of using a scavenger gas, the transversal stream of scavenger gas is increased by increasing the amount of gas inlet per time unit and/or increasing suctioning power at the gas removing port.

One may further continuously reduce the plasma discharge intensity, but thereby preventing extinction of the discharge. Thereby, the dust trapping effect of the plasma discharge is steadily reduced, which improves sweeping out of the dust particles by the said transversal force field.

By simultaneously reducing the discharge intensity and increasing the lateral pumping power and/or the amount of inlet scavenger gas per time unit, a maximum sweep-out of the dust particles from the coating area adjacent workpiece carrier electrode 62, according to FIG. 7, is reached.

Principally, the inventively applied transversal force field may be enhanced by operating the plasma discharge in a timely pulsed manner. Thereby, the average dust trapping effect of the plasma discharge is reduced and the controlled sweeping out of excess powder is simplified. This is not only valid for stopping the coating process, but also during coating.

It is essential that the plasma discharge is maintained up to the moment when the dust entrapped therein is at least substantially removed before the coating process is stopped.

This recognition leads to a further preferred mode of operation, according to which a plasma discharge is maintained in the plasma reactor chamber even then, when e.g. workpieces are loaded or disloaded to or from such reactor chamber.

A plasma discharge, which is, with respect to the reactive coating process, ineffective, so in a gas which is neutral with respect to the coating process, may be applied, with the target to etch-clean art uncoated or a coated workpiece or the plasma reactor chamber. E.g. a hydrogen plasma may be used for this target. It is thereby important that by such an etching plasma, also particles residing on the workpieces are trapped from the discharge and may be swept out as was described.

Thus, e.g. at the end of a treatment process, a hydrogen cleaning plasma may be installed, e.g. during discharge and re-loading of the plasma chamber with workpieces. Because for etching dust in the plasma discharge is only a disturbing factor, the transversal force field is thereby adjusted to its maximum effect.

By operating an RF plasma discharge for a reactive coating process by the method which was described based on FIG. 7, for generating α-Si-layers of defect-free quality and without dust deposition within the reactor, the coating rate, i.e. the amount of coating material deposited per time unit, was risen by a factor of about 2.5 and simultaneously the inherent layer stress was reduced by a factor of about 2.5. Due to the increased deposition rate, the purity of the resulting layer was improved by a factor of approx. 2. This compared with a coating process in the same plasma reactor chamber, during which, by means of well-known techniques, it was attempted to keep the dust density minimal by selecting a process working point at low pressures and at low power. When using the said known technique of dust density minimalizing, the coating rate for α-Si-layers is smaller or equal 4 Å/sec with layer stress larger than $5 \times 10^9$ dyn/cm$^2$. In opposition thereto, the inventive technique of dust density control leads to deposition rates of more than 10 Å/sec, so to rates of e.g. 33 Å/sec at layer stress smaller than $2 \times 10^9$ dyn/cm$^2$.

As was already mentioned, the preferred mode for realizing the transversal force field is to install a transversal gas stream, as has been explained with the help of FIG. 7, across the plasma discharge.

In FIG. 8, five different variants a) to e) are shown to contribute to installing the said transversal force field, i.e. the said pressure gradient, by measures taken on the suction side, i.e. on the gas removing side of the reactor.

Figure 8A:
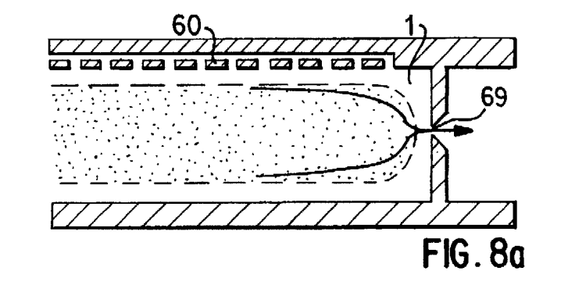
FIGS. 8a to 8b show different preferred embodiments for generating by gas suctioning from the plasma discharge space a field of force acting on dust in the plasma discharge by which field inventively the dust density and its distribution is controlled.

According to FIG. 8a, pumping of gas from the treatment space or the discharge space is realized through a narrow slit 69 in the wall of the plasma reactor chamber 1, which wall being electrically led on a defined potential, so e.g. on ground potential. The width of the slit is so that the plasma discharge may not expand across the slit 69 and preferably is in the range of between 2 to 4 mm. In a preferred manner, the transversal gas stream discussed with respect to FIG. 7 is significantly co-realized by gas inlet through the scavenger gas inlet shown in FIG. 7, which is also done at the embodiments according to FIG. 8b to 8e.

Figure 8B:
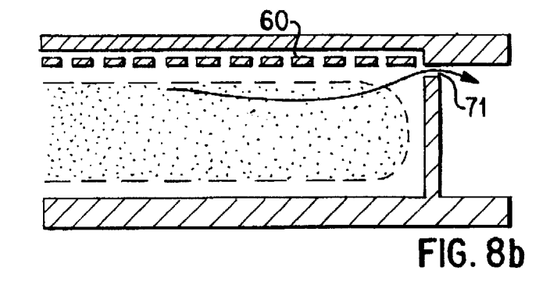

According to FIG. 8b, a suctioning or pumping slit 71 is provided adjacent to the edge of electrode 60. Thereby, a further principle is preferably followed. It was recognized that dust density is maximum there where the electric field feeding the plasma discharge is maximum. This is, as well-known, at edges and spikes of equipotential surfaces. This is the reason why, according to FIG. 8b, pumping is realized by means of slit 71 adjacent to the corner of electrode 60, i.e. in an area where an increased dust density prevails because of the increased electric field strength.

Figure 8C:
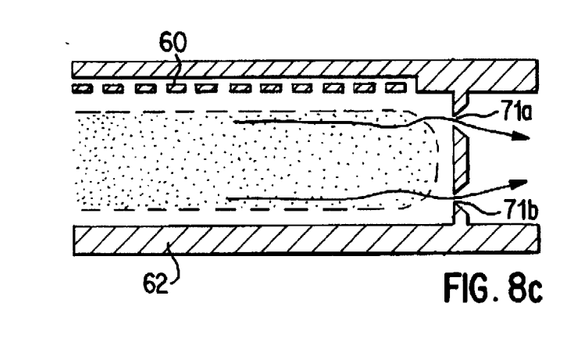

In the embodiment according to FIG. 8c this concept is followed up in that suctioning or pumping slits 71a and 71b are provided on both sides adjacent the edges of the two electrodes 60 and 62.

Figure 8D:
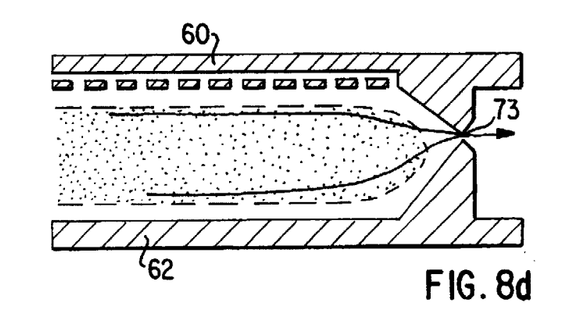

The velocity of transversal gas stream is increased by the embodiment according to FIG. 8d which shows a steadily converging suctioning slit 73. The increase of the said velocity becomes effective in a more expanded part of the plasma discharge area, so that efficiency of transversal scavenger gas flow with respect to dust density control is improved.

Figure 8E:
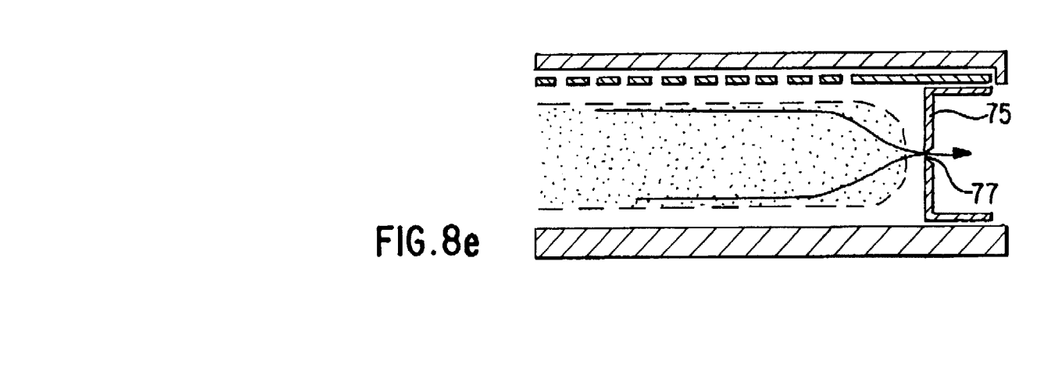

According to FIG. 8e, the wall part 75 of the plasma reactor chamber 1, wherein the suctioning slit 77 is provided, is operated electrically on floating potential. Thereby it is reached that the electrostatical potential barrier, which has to be overcome by the powder particles as they are extracted from the discharge, is lowered. This because the electric potential of the wall part 75, operated on floating potential, will assume an intermediate value between the potentials of the electrodes 60 and 62.

A further possibility which is quite obvious is to provide across the suctioning slit a grid. Thereby, the opening of the slit and thus the pump-effective cross-section of the pumping pipe may be enlarged, without that the plasma discharge penetrates through the slit.

It is further evident that the features of the gas removing arrangements, according to the embodiments of FIG. 8, may be combined.

Looking back to the novel apparatus configuration with plasma chamber staples, there is shown, in FIG. 9, how at such an apparatus, and considering the just described novel approach, charging and unloading the plasma chambers 1 is preferably carried out.

Figure 9A:
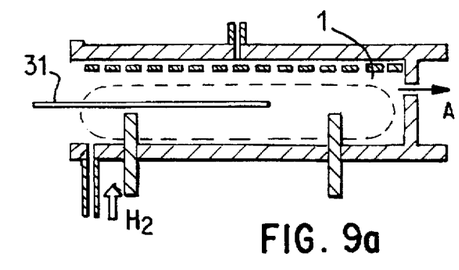
FIGS. 9a to 9g show an operating sequence of a preferred operation cycle for realizing the inventive method, whereby it is ensured that, irrespective of current workpiece treatment, dust is trapped in a plasma discharge and is controllably removed therefrom.
Figure 9B:
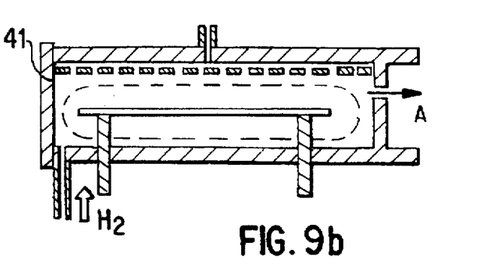

According to FIG. 9a, a workpiece 31 (see FIG. 2a) is deposited on the rods 13 of a lifting mechanism 9. According to FIG. 9b, as workpieces 31 have been introduced into the chambers 1 and a pressure difference may be installed between chamber 1 and transport area $23_T$, there is ignited a neutral plasma in the plasma chamber 1, after such a pressure difference has been installed between the inside of the plasma chamber 1 and the transport area $23_T$ according to FIG. 3, by means of the shutting-off plates 41. Such a plasma is maintained during the steps according to FIGS. 9b and 9c. A nonreactive gas, so e.g. argon and/or hydrogen, is inlet to the reactor chamber as shown. Thereby, and as was described, the workpiece 31 is also heated up, so e.g. for its degasing. Suctioning at A is active.

Figure 9C:
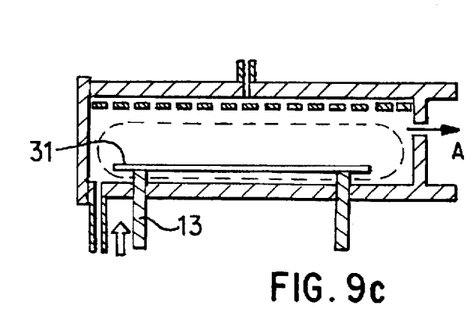
Figure 9D:
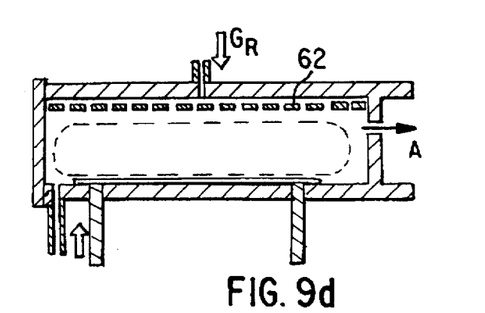

Dust which has e.g. formed during mechanical movement of the workpiece 31, according to FIG. 9c, is trapped in the neutral plasma and is removed by means of the neutral gas transversal stream at suctioning port A. As soon as, according to FIG. 9d, the workpiece 31 has been lowered in its treatment position, the reactive gas inlet is initiated in a preferred manner through the gas inlet shower formed by the RF electrode 62, as well as through the lateral scavenger gas inlet as shown. During the coating process following up the dust density in the plasma discharge is not minimized, but is, as was described with the help of FIG. 7, controllably adjusted so as not to grow above a predetermined level.

Figure 9E:
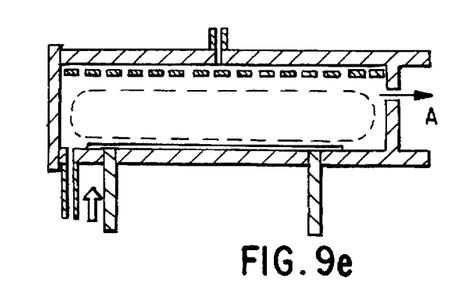
Figure 9F:
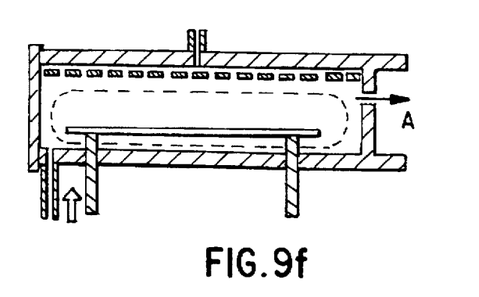

After termination of the coating process, and according to FIG. 9e, the transversal stream of reactive gas is increased or there is injected a neutral gas or there is switched onto a neutral plasma discharge (not shown), as was earlier described. It is important that also during lifting up of the coated workpieces, according to FIG. 9f, there is maintained a dust trapping plasma discharge, be it a neutral plasma discharge or the reactive plasma discharge, latter in the case where coating process needs not to be terminated at a well-defined moment.

Figure 9G:
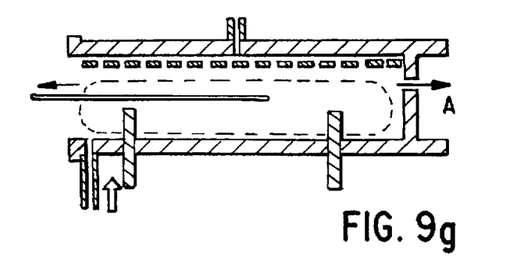

According to FIG. 9g, thereafter, the workpiece 31 is removed from the plasma chamber 1. In this operating phase, as well as possibly in that shown in FIG. 9a, but especially in that of FIG. 9b, it is preferred to also maintain a plasma discharge, not a reactive plasma discharge, but a neutral plasma discharge, especially a hydrogen plasma discharge. This, on one hand, for further trapping dust particles, and, on the other hand, for cleaning-etching the inside of plasma reactor chamber 1.

As is shown in the FIGS. 9a and 9g, there is introduced therefore hydrogen gas and, on the other hand, gas is removed by suctioning, so that dust trapped in the plasma is removed from the reactor chamber as completely as possible in the respective operating phases.

Additionally to the described gas suctioning ports, co-installing the transversal gas stream, additional suctioning openings may be provided, so e.g. along the electrode 60, and distributed as the reactive gas inlet openings therealong. By specific layout of the distribution of such gas inlet and outlet openings, the homogenity of the coating along the workpiece surfaces, thus the resulting thickness uniformity of the film deposited, may possibly be optimized.

As was mentioned above, the described inventive apparatus and the described inventive method are especially suited for the production of flat active display screens.

We claim:

1. A method for improving treatment rate of a plasma enhanced vacuum treatment process of a workpiece surface, comprising the steps of
   (a) generating dust substantially along said surface to be treated,
   (b) applying a field of force parallel to said workpiece surface and acting upon said dust,
   (c) removing by said field of force dust being generated in excess to an amount of dust resulting in a predetermined non-vanishing density of dust trapped in said plasma.

2. The method of claim 1, thereby generating said field of force at least partially by generating a gradient of pressure.

3. The method of claim 1, thereby generating said field of force by at least one of an electrostatic and of a thermal gradient.

4. The method of claim 2, thereby generating said gradient of pressure at least in part by suctioning at a distinct area laterally with respect to said surface.

5. The method of claim 2, thereby generating said gradient of pressure at least in part by injecting a gas at a distinct area laterally with respect to said surface.

6. The method of claim 5, thereby generating said injection in a constant manner or in a pulsed manner.

7. The method of claim 1, wherein applying said field of force, comprising injecting a gas at least with an amount of reactive gas towards said surface and into said plasma.

8. The method of claim 7, thereby injecting said gas at an area opposite to said surface and in a homogeneously distributed manner towards said surface.

9. The method of claim 8, thereby selecting said distribution of injecting according to a predetermined distribution of treatment effect along said surface.

10. The method of claim 1, thereby generating a negative source of said field of force in an area of increased local dust density.

11. The method of claim 10, thereby applying said negative source in an area adjacent of edges of an electrode arrangement for generating said plasma.

12. The method of claim 1, thereby controlling said density of said dust in one of an open-loop controlled manner and a negative feedback controlled manner.

13. The method of claim 1, wherein said treatment is one of reactive plasma etching, reactive plasma sputter coating and reactive ion plating.

14. The method of claim 1, wherein said treatment is a plasma enhanced chemical vapor deposition coating.

15. The method of claim 1, wherein said plasma is pulsed.

16. The method of claim 1, wherein said workpiece to be treated is a substantially planar large area workpiece.

17. The method of claim 16, wherein said workpiece is a flat active display screen.

18. A vacuum plasma chamber with means for generating a three-dimensionally distributed plasma discharge in a discharge space and a workpiece support defining a support area for at least one workpiece to be treated and for exposing at least one workpiece surface area to said plasma discharge in said discharge space, comprising force means for generating a field of force substantially parallel to and along said support area and within said plasma discharge space for controlling the density of dust in said plasma discharge space, and a dust density measurement arrangement, the output signal thereof being fed to means for adjusting said field of force, said measuring arrangement being a measuring means for said density in a negative feedback control loop for controlling said density in said plasma discharge space, said control loop further comprising a signal generator for generating a non-vanishing rated signal for said density in said plasma discharge space.

19. The chamber of claim 18, wherein said force generating means comprise a suction line arrangement connected to said chamber at a distinct area adjacent the periphery of said support area.

20. The chamber of claim 18, wherein said force generating means comprise a gas injection line arrangement connected to said chamber at a distinct area adjacent the periphery of said support area.

21. The chamber of claim 20, wherein said gas injection line arrangement is controllable at least with respect to the amount of gas injected per time unit into said chamber.

22. The chamber of claim 20, wherein said gas injection arrangement is connected to a gas tank arrangement comprising at least one of a working gas for said plasma discharge and a reactive gas.

23. The chamber of claim 18, wherein said force generator means comprise an injection line arrangement abutting in said plasma discharge space opposite to said support area, said injection arrangement comprising distributed injection openings connected to a reactive gas tank.

24. The chamber of claim 23, further comprising suctioning means with suctioning openings arranged between said injection openings in a distributed manner.

25. The chamber of claim 23, wherein said distributed injection openings are provided in an electrode of an electrode arrangement for generating said plasma discharge.

26. The chamber of claim 23, wherein said force generating means comprise a negative source arranged in an area within said chamber, whereat a significantly risen density of dust occurs compared with locally averaged density in said plasma discharge.

27. The chamber of claim 18, wherein the chamber is one of a reactive plasma etching chamber, a reactive plasma sputter coating chamber and of a reactive ion plating chamber.

28. The chamber of claim 18, wherein the chamber is a plasma enhanced chemical vapor deposition coating chamber.

29. The chamber of claim 18, wherein said means generating said plasma discharge generate a pulsed plasma discharge.

30. The chamber of claim 18, wherein said workpiece holder is constructed for substantially flat large-area workpieces.

31. The chamber of claim 30, wherein said workpiece support is constructed to support flat active display screens.

* * * * *